United States Patent [19]

Kuth

[11] Patent Number: 5,514,833
[45] Date of Patent: May 7, 1996

[54] SHIELDED CHAMBER HAVING A NON-DISRUPTIVE CATHODE RAY DISPLAY ARRANGEMENT

[75] Inventor: Rainer Kuth, Herzogenaurach, Germany

[73] Assignee: Siemens Aktiengesellschaft, Munich, Germany

[21] Appl. No.: 239,118

[22] Filed: May 6, 1994

[30] Foreign Application Priority Data

May 18, 1993 [DE] Germany ............................ 43 16 642.3

[51] Int. Cl.⁶ .................................................. H05K 9/00
[52] U.S. Cl. ................................. 174/35 R; 364/413.22
[58] Field of Search ......................... 206/332; 128/653.2; 174/35 R, 35 MS, 35 GC, 35 C; 364/413.01, 413.02, 413.03, 413.13, 413.22, 708.1

[56] References Cited

U.S. PATENT DOCUMENTS

| | | | |
|---|---|---|---|
| 4,901,141 | 2/1990 | Costello | 358/93 |
| 4,970,457 | 11/1990 | Kaufmann et al. | 324/309 |
| 4,972,836 | 11/1990 | Schenck et al. | 128/653.2 |
| 5,134,373 | 7/1992 | Tsuruno et al. | 324/309 |
| 5,184,074 | 2/1993 | Kaufman et al. | 324/309 |
| 5,239,265 | 8/1993 | Sugahara | 324/309 |
| 5,365,927 | 11/1994 | Roemer et al. | 128/653.2 |
| 5,394,873 | 3/1995 | Kraemer et al. | 128/653.2 |
| 5,412,419 | 5/1995 | Ziarati | 348/61 |

FOREIGN PATENT DOCUMENTS

| | | |
|---|---|---|
| 0042369 | 12/1981 | European Pat. Off. . |
| 3434676C2 | 7/1988 | Germany . |
| 9017344 U | 4/1991 | Germany . |
| 4205510C1 | 4/1993 | Germany . |

OTHER PUBLICATIONS

"Kernspintomographen brauchen Abschirmung," Schaller, et al., Siemens Components vol. 22, No. 4 (1984) pp. 160–164.

"Abschirmkabinen in medizinischer Diagnose und Halbleiter–Technologie," Best, et al., etz Bd. vol. 110, No. 16 (1989) pp. 814–819.

Primary Examiner—Kristine L. Kincaid
Assistant Examiner—Christopher Horgan
Attorney, Agent, or Firm—Hill, Steadman & Simpson

[57] ABSTRACT

Normally a cathode ray monitor cannot be employed in a chamber which is shielded against high-frequency interference because of the disturbances in the otherwise shielded chamber produced by the operation of the cathode ray monitor. A display arrangement employing a cathode ray monitor is disclosed, which can be used in a shielded chamber, including a projection picture tube disposed outside of the shielded chamber, a projection disposed inside of the shielded chamber, and an optical imaging arrangement disposed in the beam path between the projection picture tube and the projection screen, the beam path extending through a light-transmissive port in a wall of the shielded chamber.

5 Claims, 1 Drawing Sheet

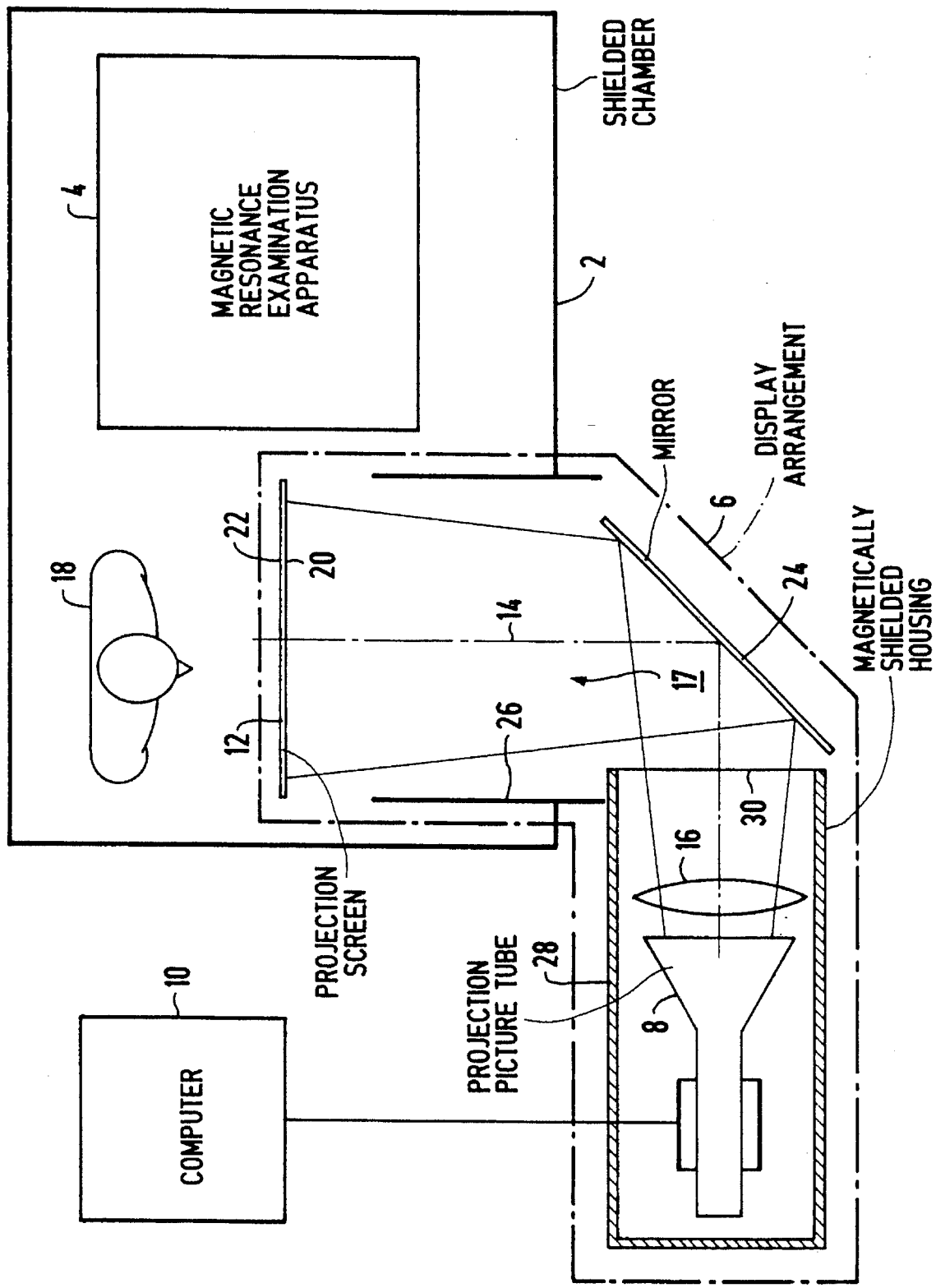

SHIELDED CHAMBER HAVING A NON-DISRUPTIVE CATHODE RAY DISPLAY ARRANGEMENT

BACKGROUND OF THE INVENTION

1. Field of the Invention

The present invention is directed to a shielded chamber which includes a display arrangement, including a monitor for displaying information generated by a computer.

2. Description of the Prior Art

If conventional cathode ray monitors are operated inside a shielded chamber, which is equipped for high-frequency shielding for conducting, for example, high-frequency measurements, such conventional monitors significantly interfere with the measurements being undertaken due to noise produced by the operation of the monitors. Conversely, the operation of such conventional monitors can be affected by the magnetic or electromagnetic fields which may be present in the shielded chamber, unless specific shielding measures are undertaken with regard to the monitor.

Such mutually disruptive influences have heretofore prevented the use of cathode ray monitors within the actual measurement environment of magnetic resonance systems or biomagnetic measurement systems. Particularly, in magnetic resonance system, which generate strong static and dynamic magnetic fields, a pronounced noise effect on such monitors occurs. If such systems are controlled using cathode ray monitors which display graphic user interface images, the operation of the system must ensue from a console disposed outside of the shielded room or chamber in which the measurement takes place.

For theses reasons, if a display has been included within the region in which a measurement takes place in diagnostic magnetic resonance systems, such displays have been plasma or liquid crystal displays. Plasma displays are not capable of providing the user with the same amount of information as a cathode ray display. Plasma displays are driven by a separate processor, and require specific software. The resolution and the color reproduction of plasma displays also fall far short of the resolution which can be achieved in a cathode ray monitor. Liquid crystal displays have a limited resolution and bandwidth and a limited viewing angle.

SUMMARY OF THE INVENTION

It is an object of the present invention to provide a display arrangement which can produce an image inside a shielded chamber having resolution and reproduction quality corresponding to that of a conventional cathode ray display image, without disrupting the measurements being undertaken in the shielded chamber and without those measurements influencing the operation of the display arrangement.

The above object is achieved in accordance with the principles of the present invention in a display arrangement including a projection picture tube disposed outside of the shielded chamber, a projection screen disposed inside of the shielded chamber, an imaging arrangement disposed in a beam path between the projection picture tube and the projection screen for directing optical information generated by the projection picture tube onto the projection screen for display thereof to a viewer inside of the shielded chamber, and a light-transmissive port for the beam path arranged in a wall of the shielded chamber.

Information can thus be displayed with high resolution and high reproduction quality inside a shielded chamber during an examination. In diagnostic magnetic resonance systems, this permits the measurements to be undertaken simultaneously with the display of the image, and thus enables modern methods known as interventional magnetic resonance to be practiced, whereby magnetic resonance diagnostics are made during an operation. Standardized user interfaces such as, for example, Open Windows, OSF, MS-Windows, etc. can also be displayed inside the shielded chamber, which is not possible if a plasma display is employed.

In a further embodiment of the invention the projection screen can be a transparent projection screen, with the imaging arrangement being disposed at a rear side of the screen, i.e., the side thereof opposite to the viewing side of the projection screen. The viewer and/or user of the system thus not disturb the optical beam path.

In a further embodiment of the invention, the light-transmissive port is formed by a tubular part which surrounds the beam path in the region of the wall, and is composed of shielding material. Despite this relatively simple structural solution for the opening, the shielding effect of the shielding chamber is substantially preserved.

In a further embodiment, the projection picture tube is disposed in a magnetically shielded housing, the magnetically shielded housing having a light-transmissive port for the beam path. The projection picture tube can be arranged in the proximity of the strong magnetic fields which are present in the operation of a magnetic resonance system.

In a further version of the above embodiment, the magnetically shielded housing laterally surrounds a portion of the beam path, beginning at the projection picture tube. A good magnetic shielding effect by the housing is thus achieved, despite the opening for the beam path.

DESCRIPTION OF THE DRAWINGS

The single FIGURE is a plan view of a display arrangement constructed in accordance with the principles of the present invention in combination with a shielded chamber.

DESCRIPTION OF THE PREFERRED EMBODIMENTS

A shielded chamber 2 is shown in FIGURE fashioned as a high-frequency cubical in which magnetic resonance examinations can be undertaken. The shielded chamber 2 is shielded on all sides, and is accessible via a door (not shown). A magnetic resonance examination apparatus 4 is located inside the shielded chamber 2. During operation, strong static and dynamic magnetic fields are generated by the magnetic resonance examination apparatus 4, as are strong electromagnetic high-frequency fields for producing resonating nuclear spins in an examination region. Sensitive antennae for the reception of the small echo signals are also a part of the magnetic resonance examination apparatus 4.

The shielded chamber 2 is equipped with a display arrangement 6, by means of which image information can be displayed inside the shielded chamber 2 with good image quality. The display arrangement 6 is constructed so that the operation thereof is not disrupted either the magnetic and electromagnetic fields generated by the magnetic resonance examination apparatus 4, and so that the display arrangement 6 does not disrupt the sensitive reception channels in the magnetic resonance examination apparatus 4. Accordingly, the display arrangement 6 includes a projection picture tube 8 (or, alternatively, a flying spot tube) which can display information with high light intensity and sharpness with only a small deflection angle of the electron beam. The displayed information generated by the projection picture tube 8 is representative of informational signals supplied, for example, by an imaging computer 10 in communication with the magnetic resonance examination apparatus 4, and disposed outside of the shielded chamber 2. A further characteristic of the projection picture tube 8 is that it can process signals having a large bandwidth, for example, 60 frames per second with a resolution of 1024 lines and 1280 dots per line. A suitable projection picture tube 8 can be commercially obtained, for example, from Pritzel Elektronik, Prutting bei Rosenheim, of the type designated High-Resolution-Video-Projector.

A projection screen 12 is arranged inside of the shielded chamber 2, as part of the display arrangement 6. An imaging system 16, which images the optical information generated by the projection picture tube 8 onto the projection screen 12, is disposed in the beam path 14 for the display arrangement 6. The beam path 14 emanates from the projection picture tube 8 and extends to the projection screen 12. The imaging system 16 may be disposed, for example, in front of the projection picture tube 8.

The shielded chamber 2 has a wall with a light-transmissive port 17 therein for the beam path 14. In order to avoid an operator or viewer 18 from disturbing the beam path 14, the projection screen 12 can be transparent. The image information generated by the projection picture tube 8 is projected via the imaging system 16 onto a rear side 20 of the projection screen 12, i.e., the side of the projection screen 12 lying opposite the viewing side 22. Moreover, deflection mirrors 24 can be disposed in the beam path 14 in order to be able to match the display arrangement 6 to given conditions, for example, to be able to arrange the projection picture tube 8 in a region which is particularly insusceptible to disturbances.

The light-transmissive port 17 for the beam path 14 which is required in a wall of the shielded chamber 2 can be formed by a tubular part 26 which laterally surrounds the beam path 14 in the region of the wall, and which is composed of shielding material, for example a suitable metal. The tubular part 26 prevents the shielding effect of the shielded chamber 2 from being substantially diminished in the region of the opening 17.

For shielding against the strong static and dynamic magnetic fields emanating from the magnetic resonance examination apparatus 4, the projection picture tube 8 can be enclosed by a magnetically shielding housing 28, having a light-transmissive port 30 for the beam path 14. In order to improve the shielding effect of the housing 28 in the region of the opening 30, the housing 28 surrounds a portion of the beam path 14 which emanates from the projection picture tube 8.

The display arrangement 6 disclosed herein can be utilized in shielded chambers 2 which are designed for shielding quantities other than the high-frequency electromagnetic fields and high magnetic fields described in the exemplary embodiment. The display arrangement 6 can be used in the same form disclosed herein, for example, in a biomagnetic measurement systems, wherein the chamber 2 will be a magnetically shielded chamber.

Although modifications and changes may be suggested by those skilled in the art, it is the intention of the inventor to embody within the patent warranted hereon all changes and modifications as reasonably and properly come within the scope of his contribution to the art.

I claim as my invention:

1. A display arrangement for use with a shielded chamber containing interference-producing and interference-susceptible components for conducting an examination of a subject, said display arrangement comprising:

computer means disposed outside of said shielded chamber for generating user interface information useable in conducting said examination;

a projection picture tube disposed outside of said shielded chamber, said projection picture tube being connected to said computer means and generating user interface images corresponding to said user interface information generated by said computer means;

a projection screen disposed inside of said shielded chamber, said projection picture tube and said projection screen defining a beam path therebetween;

imaging means disposed in said beam path for imaging said user interface images generated by said projection picture tube onto said projection screen; and a light-transmissive port disposed in a wall of said shielded chamber through which said beam path passes.

2. A display arrangement as claimed in claim 1 wherein said projection screen comprises a transparent projection screen having a viewing side and a rear side opposite said viewing side, and wherein said imaging means comprises means for imaging said user interface images onto said rear side of said transparent projection screen.

3. A display arrangement as claimed in claim 2 wherein said light-transmissive port comprises a tubular part laterally surrounding said beam path in a region of the wall of said shielded chamber, said tubular part consisting of shielding material.

4. A display arrangement as claimed in claim 1 further comprising a magnetically shielding housing enclosing said projection picture tube, said housing having said light-transmissive port therein through which said beam path passes.

5. A display arrangement as claimed in claim 4 wherein said housing has a portion laterally surrounding a part of said beam path beginning at said projection picture tube.

\* \* \* \* \*